United States Patent [19]

Wermuth et al.

[11] Patent Number: 4,903,020

[45] Date of Patent: Feb. 20, 1990

[54] METHOD AND APPARATUS FOR DIGITALLY PROCESSING STORED COMPRESSED ANALOG SIGNALS

[75] Inventors: Jürgen Wermuth, Peine; Heinz Göckler, Backnang, both of Fed. Rep. of Germany

[73] Assignee: ANT Nachrichtentechnik GmbH, Backnang, Fed. Rep. of Germany

[21] Appl. No.: 254,117

[22] Filed: Oct. 5, 1988

[30] Foreign Application Priority Data

Oct. 6, 1987 [DE] Fed. Rep. of Germany ....... 3733738
May 4, 1988 [DE] Fed. Rep. of Germany ....... 3815079

[51] Int. Cl.$^4$ .............................................. H04C 3/00
[52] U.S. Cl. ..................... 341/106; 341/67; 341/155
[58] Field of Search ............... 341/61, 67, 106, 155, 341/110

[56] References Cited

U.S. PATENT DOCUMENTS 4,355,306 10/1982 Mitchell ............................... 341/67
4,394,774 7/1983 Widergren et al. ................... 341/61
4,583,074 4/1986 Okamoto et al. .................... 341/106
4,626,829 12/1986 Hauck .................................. 341/106

OTHER PUBLICATIONS

Jürgen Wermuth, "Compandersystem 'telcom' c4'", Fernseh-und Kino-Technik, vol. 34, No. 3, 1980, pp. 91–94.

Primary Examiner—William M. Shoop, Jr.
Assistant Examiner—Helen Kim
Attorney, Agent, or Firm—Spencer & Frank

[57] ABSTRACT

Method and apparatus for processing compressed, stored analog signals, such as audio signals, from a storage medium, including first converting the signals to digital signals and thereafter expanding the signals.

To realize a large volume range in the conversion of compressed recorded signals to expand digital signals, the compressed analog signals picked up from a storage medium are initially analog/digital converted and only then digitally expanded.

30 Claims, 4 Drawing Sheets

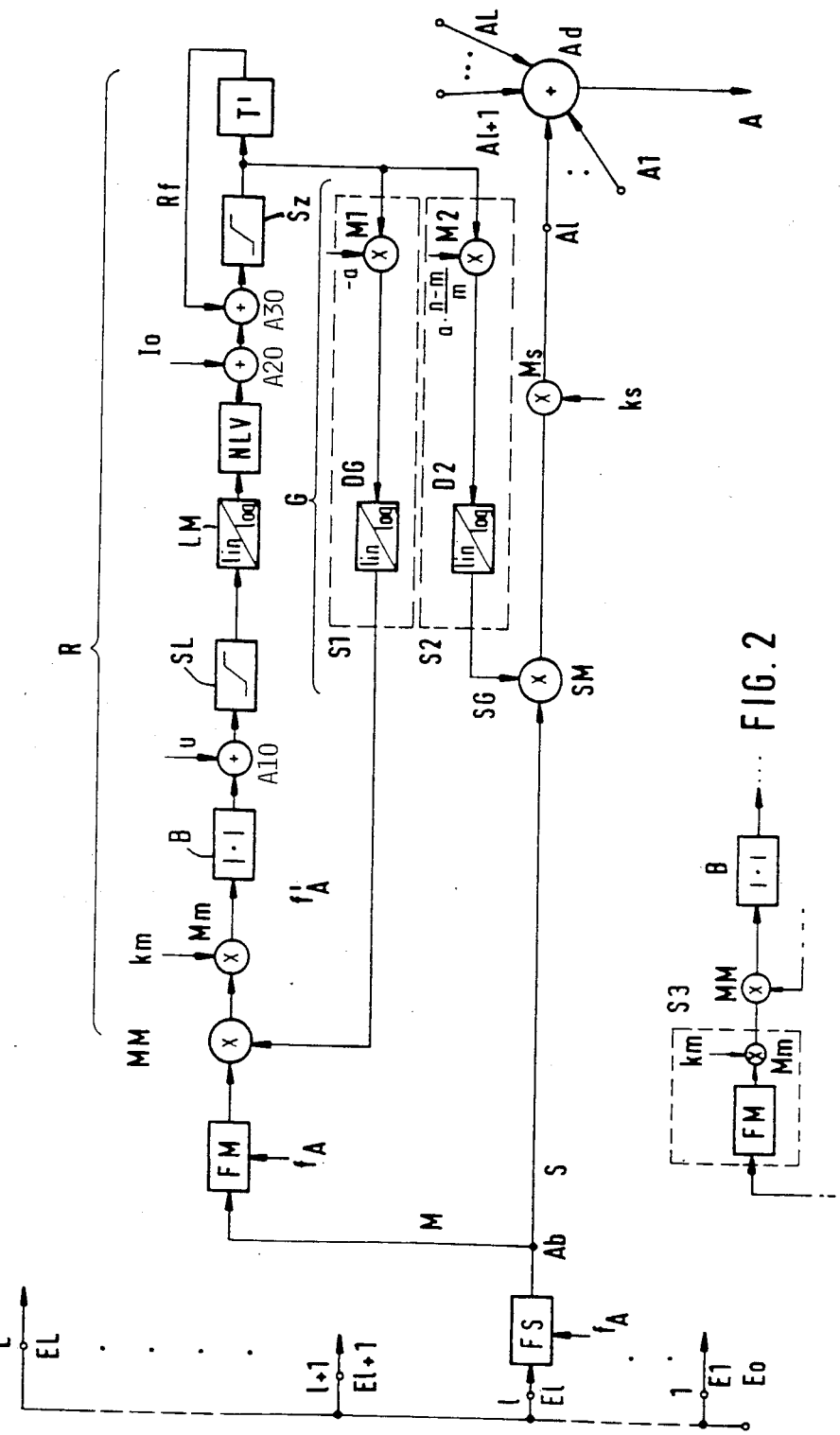

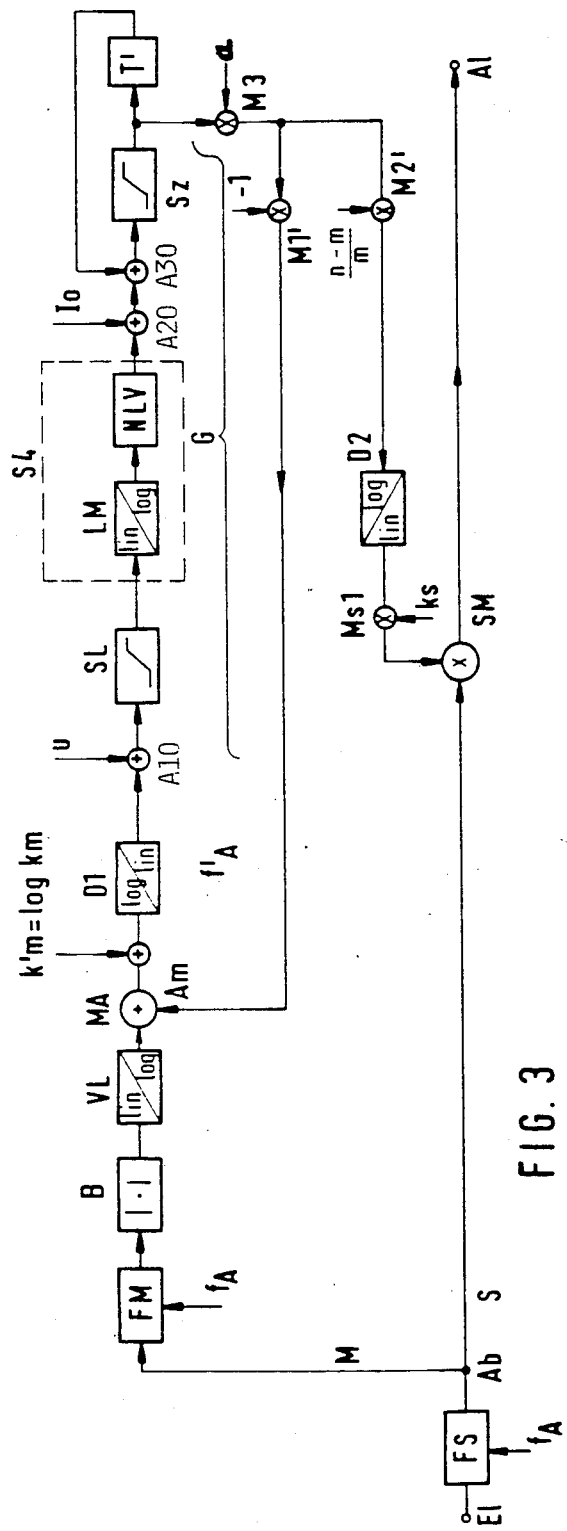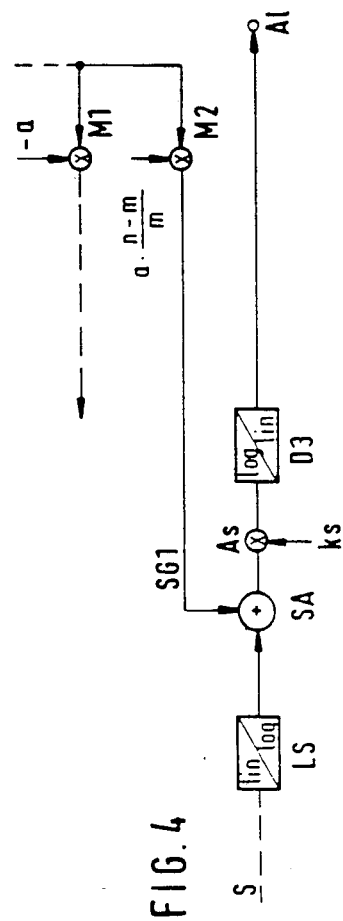
FIG. 3
FIG. 4

$y = a + bx + cx^2 + dx^3$

METHOD AND APPARATUS FOR DIGITALLY PROCESSING STORED COMPRESSED ANALOG SIGNALS

BACKGROUND OF THE INVENTION

The present invention relates to a method and apparatus for digitally processing stored, compressed analog signals. The present invention has a particular utility in processing analog signals, such as audio signals stored in compressed form on a storage medium such as a magnetic tape, such that the recorded signals may be transmitted either in digital or analog form, processed further and/or re-recorded.

In the past, audio recordings have often been preserved in a compressed analog manner in order to suppress noise. The analog signals are dynamically compressed, as is conventional. Such compression, of course, is well-known for improving the signal-to-noise ratio by volume (gain) compression of the analog signals so that weak signal components are not lost in the background and so that strong signals do not overload the system. To realize a natural sounding reproduction, the storage media utilized for the audio preservation were then scanned with the aid of an analog expander.

Since digital technology has become more and more accepted, there often exists the need to convert signals picked up from storage media containing analog signals, that were recorded in a compressed manner, into digital signals. The ultimate aim is to produce a natural sounding reproduction with the least amount of noise, i.e., with a large volume range.

E. Schrel,uml/o/ der, J. Wermuth, "Ein neues Kompandersystem-Grundlagen und Einsatzmöglichkeiten" [A Novel Compander System—Principles and Possible Uses], Fernseh-und KinoTechnik [Television and Cinematic Technology], Volume 30 (1976), No. 12, pages 427–429 (Schröder et al); J. Wermuth, "Kompandersystem "telcom C4"[Compander System "telcom C4"]Fernseh-und Kino-Technik [Television and Cinematic Technology], Volume 34, No. 3/80, pages 91-94 (Wermuth), and J. Wermuth, W. Schneider, "Design and Application of a New Compact Compander Card," Audio Engineering Society (AES), Preprint of the 79th Convention, 1985, October 12-16, New York (Wermuth et al) disclose two different principles of a fully analog compander system which is composed in each case of an analog compressor and a matching analog expander. Various variations thereof are disclosed.

The basic principle of an analog expander is described in Schröder et al, paragraph 3 (3.2) and paragraph 4. A more recent version can be found in Wermuth et al (FIG. 5). Also, a distinction is made between a professional version for studio applications and a simplified version for consumer use. In the professional version, the useful spectral range (0 to 20 kHz) is subdivided with the aid of filters into L partial bands (Wermuth, 4 partial bands) with each partial band having its own analog expander.

In the static case, the gain characteristic $V = P2 - P1$ (in dB) exhibits a slope m/n which is a function of the input level P1 of an analog compressor (with P2 = output level), where m and n are whole natural integers. In the aforementioned references, $m=2$ and $n=3$. The gain characteristic of the analog expander must therefore have a slope of n/m so that the two functions supplement one another in the static case to result in a total slope $(m/n).(n/m) = 1$.

SUMMARY OF THE INVENTION

The present invention converts compressed analog signals or digitized versions thereof into expanded digital signals by achieving, in digital technology, the prior technique of expanding compressed analog signals which was accomplished by an analog expander. Thus the basic principle of the analog expander is simulated in digital technology.

Accordingly, it is an object of the present invention to realize a wide volume range in the conversion of compressed recorded signals to digital signals for subsequent transmission, further processing and/or recording, with transmission also including transmission to a playback device. This object is accomplished by first converting the stored, compressed analog signals into digital signals and thereafter expanding the digital signals. The stored compressed analog signals are scanned or read, converted and digitally expanded preferably in partial bands, with each band including a regulating circuit for controlling the amount of the expansion.

It is a further object of the present invention to convert stored, compressed analog signals, where the analog signals are first scanned, converted into digital signals and then expanded with a digital expander where the digital expander includes a signal path including a node, and a measuring path, the measuring path including a node, and a regulating path providing a feedback signal to the measuring path node and an integrator in the regulating path, the integrator output also being connected to the signal path node, and weighting means for providing different weights to the integrator output in the regulating path and to the signal path node.

The present invention is based on the following considerations. It would actually be conventional to expand the compressed analog signals picked up from the storage medium, while still in the analog form, because suitable analog expanders are available for this purpose. An expanded analog signal would then result which has a large volume range. Then the expanded signal would be converted in an analog/digital converter for subsequent recording, processing, transmission, etc. It has now been found that in many cases a subsequent analog/digital converter would limit again the large volume range of the expander output signal so that an undesirable loss in volume range would result.

The present invention, however, initially takes what appears to be a complicated path in that the compressed analog signal, picked up from the storage medium is initially fed to an analog/digital converter. Since the picked up compressed analog signal has a relatively small volume range, generally no further limitation of the volume range will occur during the analog/digital conversion. Only then is the signal digitally expanded to cancel out the previous compression. The result is then an expanded digital signal which has a large volume range.

For this method, a digital expander must be employed which is able to perfectly cancel out statically as well as dynamically whatever compressor function has been employed during the preceding analog compression, i.e., an expander which simulates a suitable analog expander in a digital technology. Thus the present invention provides a digital expander which uses digital signal processing (sometimes different from the digital technology), in a manner compatible with existing analog compressors, i.e., it simulates already existing analog expanders in a system compatible manner.

BRIEF DESCRIPTION OF THE DRAWINGS

Advantageous embodiments of the invention will now be described with reference to the drawings.

FIG. 1 is a block circuit diagram of a preferred embodiment of the present invention.

FIGS. 2 to 4 illustrate, in block diagram form, variations of the present invention.

DETAILED DESCRIPTION OF THE INVENTION

Figure 5:
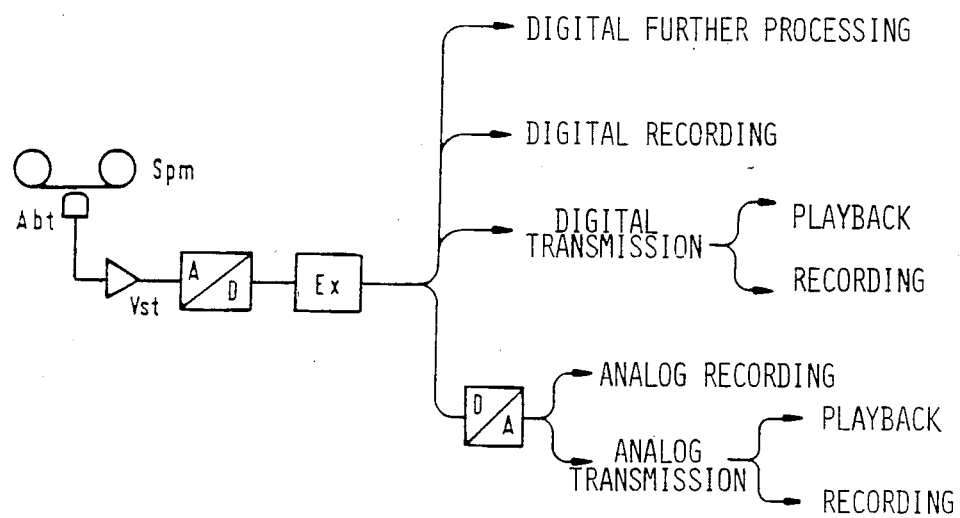
FIG. 5 shows the basic structure of an apparatus in diagrammatic form according to the principles of the present invention.

Referring to the drawings, the present invention will now be explained. FIG. 5 illustrates that from a storage medium Spm (for example a magnetic tape) on which analog signals are recorded in a compressed manner, particularly audio signals (since television signals do not experience dynamic problems due to A/D conversion), a playback device or scanner Abt, for example a magnetic head, picks up a compressed analog signal and feeds it to an amplifier Vst from where it is sent to an analog/digital converter A/D. The output of the latter is connected to a digital expander Ex from where the now digital signals are forwarded, either for further digital processing, for digital recording, for digital transmission with subsequent playback or recording, or to a D/A converter. From there, they are subjected either to analog recording or to analog transmission, followed again by either playback or recording.

The block circuit diagram shown in FIG. 1 relates to a digital expander configured according to the principles of the present invention and compatible with the compander system disclosed in the aforementioned Wermuth reference. The signal from input terminal $E_o$ is subdivided into L partial bands or branches 1, ..., 1, 1 +1, ..., L whose inputs are E1, ..., E1, E1+1, ..., EL, respectively. These branches, of which only one branch is shown in detail, all have basically the same structure but differ generally in various parameters which determine primarily the respective dynamic behavior. Additionally, different filters FS, FM are provided at the inputs of each branch to direct partial frequency bands to the different branches.

At a junction Ab, each branch is divided into a signal path S, having a signal path node, and a measuring path M, having a measuring path node. Filter FS, which operates at a sampling rate $f_A$, as does the entire signal path, performs the branch signal separation. In the signal path, a signal path multiplier SM operating as an adjusting device, evaluates the signal to be expanded (amplifies or attenuates it, etc.) and this is done with the aid of a control variable signal SG which is fed to the second input of the signal path multiplier SM and is ultimately derived from the signal at input E1. A further change to the output signal of the signal path multiplier SM is performed with a balancing means illustrated in FIG. 1 as a balancing multiplier Ms disposed in the signal path S and which is a constant ks. The digitally expanded output signal A1 from this branch is provided to a summation means or adder Ad. Finally, all branch signals, i.e., all signals at expander outputs A1, ..., Al, Al+1, ... AL are summed by means of digital addressing member or adder Ad to form the total digitally expanded signal at output A.

Reverting to one output from junction Ab in the measuring path M, there occurs a further band width limitation in a filter FM. The output signal from filter FM feeds one of the inputs of a measuring path multiplier MM which functions as part of a regulating circuit which includes regulating path R. For balancing purposes, the output signal of measuring path multiplier MM is weighted with a constant km in a balancing multiplier Mm. This is followed by an absolute value formation (suppression of the sign) in an absolute value former B, and then a correction constant U is added in an adder A10. Also included within the regulating path R is an amplitude limiter SL followed by a logarithming member or logarithmic converter LM. Due to the transition from the linear to the logarithmic representation of values (lin/log) it is accomplished that the expander characteristic is linear in the logarithmic domain which is known as "dB linear", as explained with regard to FIG. 3 of the Schröder et al reference. The first operation in the logarithmic domain is a level dependent amplification in a non-linear transmission member NLV. The non-linear transmission member may compute an output as a function of its input or may read values stored in memory. The output of the non-linear transmission member is followed by an adder A20 for the addition of a value Io, and the output of adder A20 is provided to an integrator means which includes, in an integrator-regulator path, an adder A30 connected to an amplitude limiter Sz and, in a feedback path Rf back to the adder A30, a delay member T'. The regulating circuit includes the regulating path R and a feedback return G in which the output signal of the integrator means is weighted by -a in a weighting means M1 which is a multiplier. The output of multiplier M1 is connected to an antilogarithm member or antilog converter member DG which retransforms the signals back to the linear domain (log/lin conversion), i.e., corresponding to the inverse operation of a linear/logarithmic conversion in logarithming member LM. The output signals of the antilog member DG serve as control variables within the regulating circuit in the measuring path, i.e., they are fed to measuring path multiplier MM, thus completing the regulating loop.

A control variable signal for signal path S is also derived from the output signal of the integrator means (and thus from the regulating circuit) by weighting it with a(n-m)/m in a weighting means M2 with subsequent antilog conversion in an antilogarithming member or antilog converter D2. This corresponds to the antilogarithming member DG provided in the feedback return path G of the regulating circuit in measuring path M. Parameters n and m determine the static behavior, i.e., the slope n/m of the gain characteristic of the digital expander. Selection of parameter a permits a determination of the dynamic behavior of the digital expander. The control variable signal is provided as a second input SG to the signal path multiplier SM.

The input and output signals of the digital expander are sampled at the sampling rate $f_A = 1/T$. Filters FS and FM also operate at this sampling rate. The regulating circuit including regulating path R operates at a sampling rate of $f'_A$ which may be the same as that of the expander in which case $f'_A = f_A$. If the simulation of the analog expander must meet greater requirements, $f'_A$ should be selected to equal $1/T'>f_4$, with $T'$ being the delay in the feedback branch of the integrator means. However, in all cases, the control variable signal at SG from antilogarithming member D2 can be calculated by means of the sampling rate $f_4$.

The apparatus of the present invention operates such that, with a constant input level at input El, a signal appears at the output of regulating path R which remains constant from sampled value to sampled value, i.e., control variable signal SG also remains constant. However, these signals are level dependent so that signal path multiplier SM amplifies greater or stronger signals in signal path S more than smaller or weaker signals. (Alternatively, smaller or weaker signals are lowered or attenuated more than larger or stronger signals). That, of course, is the purpose of an expander. If there are sudden upward or downward changes in level or signal strength at input El a certain transition behavior must appear at the output of regulating path R so that the desired, original signal as it existed before the compression is created at the output of the signal path multiplier SM. In this connection, it is necessary to consider the transition behavior of the analog compressor that created the input signal which is now present at the input Eo after conversion from analog to digital. This transition behavior of the analog compressor is generally different in dependence on whether the sudden change in level was upward or downward. For sudden upward changes, the transition period is very short (in a range of milliseconds) and for a sudden downward change relatively long (in a range of seconds). In order for the expander shown in FIG. 1 to exhibit a dynamic behavior, matched to the behavior of the associated analog compressor, the regulating path includes, inter alia, the non-linear transmission member NLV which produces a level-dependent amplification in the logarithmic domain. Together with the subsequently connected integrator, this determines the dynamic behavior of the expander upon the occurrence of sudden upward changes in level. The dynamic behavior during sudden downward changes, i.e., for the so-called decay, is provided primarily by a constant Io which is fed to adder A20.

For compatible use of the disclosed expander of the present invention with the systems disclosed in the aforementioned Wermuth reference, m=2 and n=3 are selected. With these values of m and n, the signal fed to multipliers M1 and M2 is weighted twice as heavily in multiplier M1 than in multiplier M2. There are two ways to realize the logarithming and antilogarithming members: either the output signals are calculated in approximation as a function of the input signals based on a series development of the input signals or the output signals are associated with the input signals on the basis of a table stored in memory.

The same applies for the non-linear transmission member NLV: either the output signals are calculated on the basis of a given mathematical function in dependence on the input signals or here again the output signals are associated with the input signals on the basis of a table stored in memory. The logarithming and antilogarithming members may be functionally combined with the respectively adjacent components as indicated by blocks S1, S2 in FIG. 1 and block S4 in FIG. 3.

Filters FS and/or FM may be composed of cascaded or parallel connected partial filters. They may be configured as digital recursive filters in canonic structure (see H. Göckler, "Einstellbare Digitalfilter für die Tontechnik" [Adjustable Digital Filters for Audio Technology]ntz Archiv, Volume 7 (1985), No. 3, pages 47–57, FIG. 2) or in a state space structure (see German Publications DE 3,522,411, published January 1987, DE 3,522,412, published January 1987, patented Mar. 17, 1988, DE 3,522,413, published January 1987, DE 3,439,977, published May 1986).

In FIG. 1, measuring path multiplier MM functions as the measuring path node and signal path multiplier SM functions as the signal path node.

Multiplications with the constant km in balancing multiplier Mm can also take place in measuring path M ahead of (i.e. prior to) measuring path multiplier MM as shown in FIG. 2. If filter FM is provided in a state space structure, it becomes possible to combine this filter with balancing multiplier Mm, identified as block S3. In this case, the filter coefficients are combined with the constant km.

Balancing multiplier Ms, illustrated in FIG. 1, can also be shifted or moved into measuring path M (i.e., prior to or ahead of the input to signal path multiplier SM). This is accomplished by providing the output of antilog converter D2 to a balancing multiplier Ms1 illustrated in FIG. 3, the output of which is then provided to signal path multiplier SM. This results in improved noise characteristics in signal path S.

FIG. 3 indicates further variations: instead of weighting means (multipliers) M1, M2 in the feedback return path G and in the path providing the control variable signal SG, respectively, in FIG. 1, FIG. 3 shows three multipliers M1', M2' and M3'. Multiplier M1' is in the feedback return path G, multiplier M2' is in the path providing the control variable signal SG, and multiplier M3, with an input of "a", provides an input common to both M1' and M2'. The effect is obviously the same. In addition, antilogarithming member DG of FIG. 1 is omitted in the feedback return G, i.e, the measuring path "node" now receives signals in the logarithmic domain while in FIG. 1 it receives signals in the linear domain. A multiplication in the linear domain corresponds to an addition in the logarithmic domain. Therefore, omission of the antilogarithming member DG in FIG. 3 requires a measuring path adder MA in FIG. 3 in place of the measuring path multiplier MM of FIG. 1. Hence the measuring path adder MA functions as the measuring path node in FIG. 3. To realize the same effect as in FIG. 1, FIG. 3 shows an additional logarithming member or converter VL between filter FM and measuring path adder MA and an antilogarithming member or converter D1 is connected in the measuring path ahead of adder A10. Instead of a multiplicative balancing constant km—in contrast to FIG. 1 - the value k'm =log km is fed to a balancing adder Am in the measuring path after adder MA and prior to antilogarithming member D1. This occurs in the logarithmic domain and therefore corresponds to a multiplication in the linear domain of FIG. 1 (with balancing multiplier Mm). The absolute value former B used in FIG. 1 ahead of adder A10 is now disposed ahead of logarithming member VL to ensure the same performance of the circuit arrangement.

Another variation is shown in FIG. 4. Here, the signal path multiplier SM of FIGS. 1 and 3 which operates in the linear domain is replaced by a signal path adder SA which operates in the logarithmic domain and which receives as a control variable signal, the signal SG1 which lies in the logarithmic domain. The signal path adder SA is preceded by a logarithming member or log converter LS and followed by an antilogarithming member or antilog converter D3 and the multiplication with ks in FIG. 1 is shifted in FIG. 4 to the logarithmic domain where it occurs as an addition with the aid of balancing adder As. Hence the signal path adder SA functions as the signal path node in FIG. 4.

Aside from all these variations, the common feature is that measuring path M is connected to a signal path node at SM or SA, and the measuring path M includes a regulating path R and a feedback return path G which is connected to a measuring path node at MM or MA. In the direction of the signal flow, the regulating circuit includes an integrator Sz - T'- Rf - A30 and the signals emanating from the integrator are weighted in different ways for feeding to the measuring path node MM or MA and to the signal path node SM or SA.

Subsequently, the two modes of operation of the non-linear transmission member NLV are described. As an example, the non-linear function $y=a+bx+cx^2+dx^3$ is chosen for illustration. Here, x is the input variable which is in a non-linear manner, as a third order polynomial, related to the associated output variable y. a,b,c and d are constants.

Figure 6:
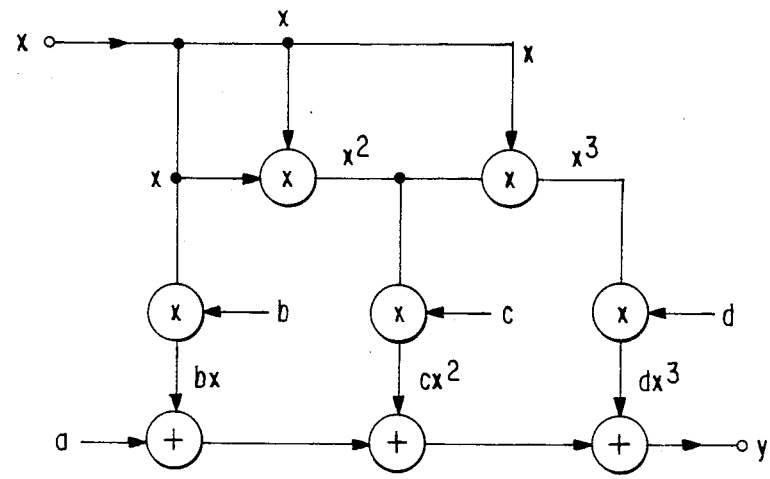
FIG. 6 is a diagram illustrating an example of the computational mode of operation for the non-linear transmission member NLV.

FIG. 6 depicts the computation mode of operation. The input variable x is fed to three different multipliers, which provide the output values bx, $x^2$ or $x^3$, respectively. Next, bx is added to a by a first adder, and $x^2$ and $x^3$ are weighted by c and d, respectively, by two other multipliers. The results of the latter multiplications are added to a+bx with the aid of two further adders to form $y=a+bx+cx^2+dx^3$.

Figure 7:
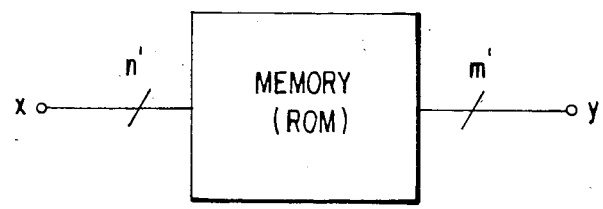
FIG. 7 shows the memory mode realization of the non-linear transmission member NLV.

FIG. 7 depicts the memory mode realization of NLV, equivalent to FIG. 6. All possible results of the non-linear relation $y=a+bx+cx^2+dx^3$ are stored in the read-only memory (ROM) for all allowed input values x. For the practical realization x and y can only be represented by a finite number of bits, namely n' or m', respectively. For this realization the m' bits of x are put as address to the ROM which then outputs the related y-value.

The invention now being fully described, it will be apparent to one of ordinary skill in the art that many changes and modifications can be made thereto without departing from the spirit or scope of the invention as set forth herein.

What is claimed is:

1. A method of processing signals scanned from a storage medium containing compressed recorded analog signals, in order to transmit them either in digital or analog form, to further process them and/or re-record them, comprising the steps of converting the scanned signals by analog/digital conversion and thereafter digitally expanding the scanned signals.

2. In a signal processing apparatus including a scanning means for scanning signals from a storage medium on which analog signals are recorded in a compressed manner and wherein the signals are to be expanded for subsequent utilization, the improvement comprising:
an A/D converter responsive to the scanned compressed analog signals for initially converting the compressed analog signals into an output of compressed digital signals, and
a digital expander having an input connected to the output of the A/D converter for digitally expanding the compressed digital signals and for providing an output.

3. The invention as defined in claim 2, wherein the digital expander includes:
a signal path at the input of said digital expander;
said signal path including a junction and a signal path node;
a measuring path connected to said junction and receiving an input therefrom, said measuring path including a measuring path node;
the measuring path further including a regulating circuit having a regulating path and a feedback path, with the feedback path output connected to the measuring path node;
the regulating path including integrator means, the output of which provides an input to the feedback path and to the signal path node; and
weighting means for weighting the output of the integrator means, with the output of the integrator means being weighted differently for the input to the feedback path, and thus to the measuring path node, and for the input to the signal path node.

4. The invention as defined in claim 3, wherein:
the measuring path node is an adder having at least two inputs;
the measuring path including a first log converter, connected between the junction and the adder, for converting the input from the junction into the logarithmic domain, with the output of the first log converter being one input to the adder; and
the regulating path including first an antilog converter and thereafter a log converter providing an input to the integrator means, with the feedback path output being in the logarithmic domain and providing a second input to said adder, the adder operating on signals in the logarithmic domain.

5. The invention as defined in claim 3, wherein:
the measuring path node is a multiplier having at least two inputs; and
the regulating path including a log converter and the feedback path including an antilog converter the output of which is provided to the measuring path node, the multiplier operating on signals in the linear domain.

6. The invention as defined claim 3, wherein:
the signal path node is an adder having at least two inputs;
the signal path including a first log converter in connected between the junction and the adder for converting the input from the junction, as one input to the adder, into the logarithmic domain and;
the signal path further including an antilog converter subsequent to and responsive to the output of the adder for converting the output of the adder into the linear domain.

7. The invention as defined in claim 3, wherein:
the signal path node is a multiplier having at least two inputs; and
an antilog converter responsive to the regulating path output and providing a signal path node input, the multiplier operating on signals in the linear domain.

8. The invention as defined in claim 3, wherein the signals from the integrator means toward the measuring path node are weighted twice as heavily as the signals from the integrator means to the signal path node.

9. The invention as defined in claim 3, wherein at least one of the measuring and signal paths includes at least one log converter and at least one antilog converter, and at least one of said converters is configured as a calculating circuit which calculates its output signals by means of a series development as a function of its respective input signals.

10. The invention as defined in claim 3, wherein at least one of the measuring and signal paths includes at least one log converter and at least one antilog converter, and at least one of said converters includes a memory and means for reading the values stored therein as output signals once they have been associated with the respective input signals.

11. The invention as defined in claim 3, wherein the regulating path includes a digital, non-linear transmission member for determining the dynamic response of said regulating path to sudden increases in level at the input to said expander.

12. The invention as defined in claim 11, Wherein the non-linear transmission member calculates its output signals as a function of its input signals.

13. The invention as defined in claim 11, wherein the non-linear transmission member includes a memory and means for reading values stored therein as the output signals once they have been associated with the respective input signals.

14. The invention as defined in claim 3 wherein the regulating circuit and the signal path each function at a sampling rate, and wherein the sampling rate in the regulating circuit is greater than the sampling rate in th signal path.

15. The invention as defined in claim 3 wherein at least one of the nodes is preceded by a filter means.

16. The invention as defined in claim 15, wherein said filter means is composed of plural, partial filters.

17. The invention as defined in claim 15, wherein said filter means is a recursive filter having a canonic structure.

18. The invention as defined in claim 15, wherein said filter means is a recursive filter having state space structure.

19. The invention as defined in claim 18, wherein a balancing multiplier is combined with said state space structure filter means in the measuring path.

20. The invention as defined in claim 3, wherein a balancing multiplier is provided at the output of the signal path multiplier when signals therefrom are present in the linear domain.

21. The invention as defined in claim 3, wherein a balancing multiplier is provided between the output of the integrator means and the input to the signal path node when signals from the integrator means are present in the linear domain.

22. The invention as defined in claim 3 wherein a balancing adder is provided at the output of the signal path adder when signals therefrom are present in the logarithmic domain.

23. The invention as defined in claim 3 wherein a balancing adder is provided at the output of the integrator means when signals therefrom are present in the logarithmic domain.

24. The invention as defined in claim 3 wherein the feedback path includes an antilog converter and at least part of said weighting means.

25. The invention as defined in claim 3 wherein at least a portion of said weighting means is combined with a subsequent antilog converter in the output of the integrator means which is connected to the signal path node.

26. The invention as defined in claim 3 wherein an absolute value former is provided in the measuring path operating on signals in the linear domain.

27. The invention as defined in claim 3 wherein an amplitude limiter is provided in the regulating path subsequent to the measuring path node.

28. The invention as defined in claim 3, wherein the integrator includes an amplitude limiter in a first path and a delay member in a return path.

29. The invention as defined in claim 28, wherein the integrator is preceded by an adder so as to add a variable which determines the dynamic response of the regulating path if there are drops in level at the expander input.

30. The invention as defined in claim 2 wherein a plurality of expanders, each for a different part of the frequency band, are connected in parallel at their inputs and combined at their outputs by way of at least one adder so as to digitally expand signals in the entire frequency band.

* * * * *